United States Patent [19]
Sato et al.

[11] Patent Number: 5,229,680
[45] Date of Patent: Jul. 20, 1993

[54] PIEZOELECTRIC TRANSFORMER USING SINGLE CRYSTAL OF LINBO₃

[75] Inventors: Masuji Sato; Noboru Wakatsuki, both of Kawasaki; Kiyoshi Nakamura, 3-18-2, Minaminakayama, Izumi-ku, Sendai-shi, Miyagi 981-32; Yoshinori Adachi, Kamakura, all of Japan

[73] Assignees: Fujitsu Limited, Kawasaki; Kiyoshi Nakamura, Sendai, both of Japan

[21] Appl. No.: 761,049

[22] Filed: Sep. 18, 1991

[30] Foreign Application Priority Data

Sep. 18, 1990 [JP] Japan ................. 2-249574

[51] Int. Cl.$^5$ .................................. H01L 41/08
[52] U.S. Cl. ........................... 310/339; 310/328; 310/357; 310/358; 310/366
[58] Field of Search ............... 310/328, 339, 357, 358, 310/366

[56] References Cited

U.S. PATENT DOCUMENTS

| | | | |
|---|---|---|---|
| 3,564,463 | 2/1971 | Beaver et al. | 333/72 |
| 3,736,446 | 5/1973 | Berlincourt et al. | 310/339 |
| 3,764,848 | 10/1973 | Berlincourt | 315/55 |
| 3,944,732 | 3/1976 | Kino | 310/334 |
| 3,956,646 | 5/1976 | Shibayama et al. | 310/313 A |
| 4,046,456 | 9/1977 | Bonne | 310/357 |
| 4,584,499 | 4/1986 | Leskovec et al. | 310/318 |
| 5,034,645 | 7/1991 | Woodruff et al. | 310/316 |

FOREIGN PATENT DOCUMENTS

| | | | |
|---|---|---|---|
| 45-11715 | 5/1970 | Japan . | |
| 0053985 | 3/1988 | Japan | 310/358 |

OTHER PUBLICATIONS

Patent Abstracts of Japan, vol. 6, No. 247 (E-146) Dec. 7, 1982 & JP-A-57 147 288 (Nippon Denki KK).
Patent Abstracts of Japan, vol. 12, No 486 (E-695) Dec. 19, 1988 & JP-A-63 200 579 (NGK Spark Plug Co.).
H. Tominaga et al., "Devices Using High-Coupling Piezoelectric Crystals," Fujitsu Sci. Tech. J., 24, 2 pages 71-99 (Jun. 1988).
H. Watanabe et al., "Energy Trapping of Higher-Harmonic Width Vibrations in Piezoelectric Strips and its Application to Filters," Trans IEICE, vol. J71-A, No. 8, pp. 1489-1498 (Aug. 1988).
Papers lectured to a meeting for presentation of researches, Japanese acoustic learned society, spring, 1990 (K. Nakamura et al., "Piezoelectric Transformers Using Single Crystals of LiNbO₃", published on Mar. 28, 1990, pp. 687 and 688).
IRE Transactions of BTR, 8-1 (P. A. Van Berkum et al., "High Voltage Ceramic Transformers", 1962-03, pp. 22-35).

*Primary Examiner*—Mark O. Budd
*Assistant Examiner*—Thomas M. Dougherty
*Attorney, Agent, or Firm*—Staas & Halsey

[57] ABSTRACT

A piezoelectric transformer includes a substrate of piezoelectric material, preferably a single crystal of LiNbO₃. The substrate is uniformly polarized in a selected direction thereof and vibrated in a direction of the length thereof. An input voltage is applied across both sides of a portion of the substrate in a direction of the thickness thereof and thus excites a vibration by way of piezoelectric effect. Thereby another voltage is caused in the direction of the thickness of the substrate in a portion other than the portion to which the input voltage is applied, and taken out as an output voltage. As a result, it is possible to decrease the output impedance to obtain a large load current and thus fully heighten a step-up ratio of the piezoelectric transformer.

30 Claims, 8 Drawing Sheets

PIEZOELECTRIC TRANSFORMER USING SINGLE CRYSTAL OF LINBO₃

BACKGROUND OF THE INVENTION

1. Field of the Invention

The present invention relates to a piezoelectric transformer and, more particularly, to a structure of a piezoelectric transformer which employs a rotated Y-cut substrate of a piezoelectric single crystal, e.g., a, single crystal of lithium niobate ($LiNbO_3$), which enables a large load current to flow therein and possesses a high stability in operation.

2. Description of the Related Art

There are various electrical appliances requiring a high voltage of five or six kilovolts or more, e.g., for deflection of an electron beam in a cathode ray tube (CRT), for electrification of a photoconductive drum in an electrostatic printing, in a transformer for a direct current (DC) converter, and the like. To supply the high voltage, electromagnetic transformers are generally employed at present. With a recent demand for small size and light weight, however, a piezoelectric transformer has been developed as a solid state device and some piezoelectric transformers have been concretely proposed.

As an example of the proposed ones, a piezoelectric transformer is known which employs a ceramic substrate having an input portion polarized in a certain direction and an output portion polarized in another direction. In this piezoelectric transformer, however, a problem occurs in that, where an excited vibration is greatly displaced, a distortion is concentrated on the portion where the direction of the polarization is changed, and thereby the substrate is broken or destroyed.

Also, since ceramic material generally presents its saturation characteristics and as an input voltage applied thereto is increased, a drawback arises in that the piezoelectric constants and elastic constants are deteriorated due to the emitted heat or other causes. This results in a lowering in stability or reliability in operation of the piezoelectric transformer.

Note, the problems in the prior art will be explained in detail later in contrast with the preferred embodiments of the present invention.

SUMMARY OF THE INVENTION

An object of the present invention is to provide a piezoelectric transformer which can decrease its output impedance thereby to obtain a large load current and thus fully heighten, or enhancer the step-up ratio thereof.

Another object of the present invention is to provide a piezoelectric transformer which can realize a stable and reliable transforming operation.

According to one aspect of the present invention, there is provided a piezoelectric transformer including a substrate of piezoelectric material, the substrate being uniformly polarized in a selected direction thereof, wherein an electrical field is applied to a portion of the substrate in a direction of the thickness thereof and thereby another electrical field is caused by way of the piezoelectric effect in the direction of the thickness of the substrate in another portion thereof and which thus is taken out as an output voltage.

According to another aspect of the present invention, there is provided a piezoelectric transformer including a substrate of piezoelectric material, the substrate being uniformly polarized in a selected direction thereof and vibrated in a direction of the length thereof, wherein an input voltage is applied across both sides of a portion of the substrate in a direction of the thickness thereof and thus excites a vibration by way of the piezoelectric effect, and thereby another voltage is caused in the direction of the thickness of the substrate in a portion other than the portion to which the input voltage is applied, and which is taken out as an output voltage.

In a preferred aspect of the present invention, the piezoelectric transformer may be constituted such that the vibration of a longitudinal mode excited in the direction of the length of the substrate is a fundamental mode vibration with half-wave length resonance.

In another preferable aspect of the present invention, the piezoelectric transformer may be constituted such that the vibration of a longitudinal mode excited in the direction of the length of the substrate is a vibration of a secondary mode with one-wave length resonance.

Also, the piezoelectric transformer may be constituted such that at least one electrode, of respective, opposite input electrodes and output electrodes provided on both sides of the substrate is formed inside from a periphery of the substrate, or may be constituted such that it further comprises a protection film formed on at least one side of the substrate, the protection film being formed on a region other than those on which lead portions for the electrodes are provided on the substrate.

Furthermore, in a preferred aspect of the present invention, the substrate of piezoelectric material may be a rotated Y-cut substrate of a single crystal of $LiNbO_3$ uniformly polarized in a Z-axis direction thereof, in particular, an angle of rotation in the rotated Y-cut substrate thereof being within a range of 120° to 160°.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments of the present invention, the problems in the prior art will be explained with reference to FIGS. 1a and 1b.

Figure 1A:
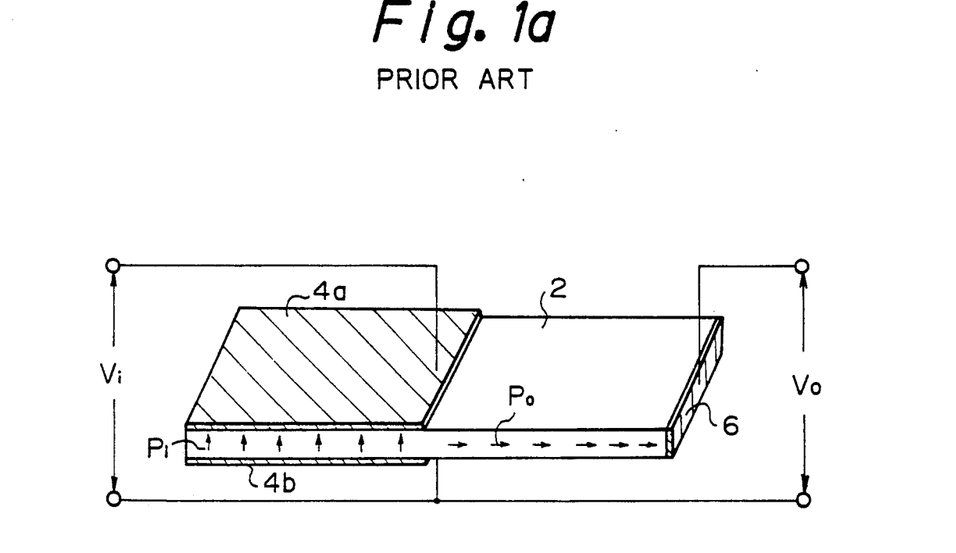
FIGS. 1a and 1b are a perspective view and a sectional view, respectively, illustrating a structure of a prior art piezoelectric transformer.
Figure 1B:
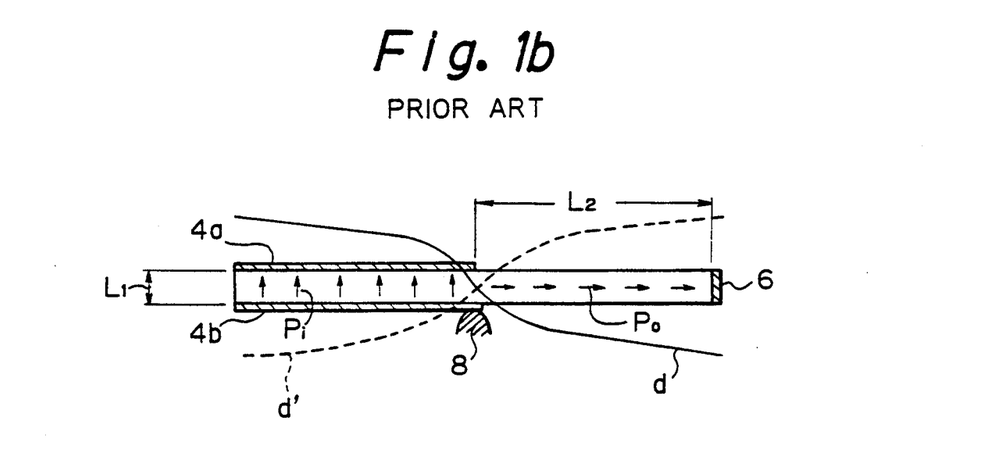

FIGS. 1a and 1b illustrate a structure of a prior art piezoelectric transformer, in a perspective view and a sectional view, respectively. The illustrated piezoelectric transformer is a typical one proposed by Rosen (C. A. Rosen: Proc., Electronic Components Symp., p. 205, 1957).

In the illustration, reference 2 denotes a ceramic substrate of piezoelectric material, e.g., barium titanate, in the form of a rectangular thin plate. The portion in the left side of the central portion of the ceramic substrate 2 is polarized in the direction of the thickness of the substrate, as shown by arrow marks Pi, while the portion in the right side thereof, is polarized in the direction of the length thereof as shown by arrow marks Po. In the left polarized portion (Pi), input electrodes 4a and 4b are formed on respective, opposite sides (i.e., main surfaces) of the substrate 2 to thereby form an input portion. Also, right polarized portion (Po), one output electrode 6 is formed on an end surface portion of the substrate 2 to thereby form an output portion together another output electrode shared with one input electrode 4b.

When an input voltage Vi with a resonant frequency determined by the dimension in the direction of the length of the substrate 2 is applied across the input electrodes 4a and 4b, a vibration is excited in the direction of the length of the substrate 2 as shown by a solid line "d" and a broken line "d'". As a result, a longitudinal piezoelectric effect is caused, to thereby generate an output voltage Vo across the output electrodes 6 and 4b. In this case, a step-up ratio (Vo/Vi) under no load at the output ends is expressed by the following equation:

$$Vo/Vi \propto K_{31} \cdot K_{32} \cdot Q_1 \cdot L_2/L_1 \quad (1)$$

Note, reference $K_{31}$ denotes an electromechanical coupling coefficient of the transverse piezoelectric effect in the input portion; reference $K_{33}$ an electromechanical coupling coefficient of the longitudinal piezoelectric effect in the output portion; reference $Q_1$ the mechanical "Q" of the ceramic substrate 2; reference $L_1$ the thickness of the ceramic substrate 2; and reference $L_2$ a length of the right polarized portion Po.

Namely, the step-up ratio (Vo/Vi) of the above piezoelectric transformer is proportional to a product of $K_{31}$ $K_{33}$ and $Q_1$. The piezoelectric transformer as a device is supported by a supporting member 8 at the central portion thereof corresponding to a node of the excited vibration (see FIG. 1b).

In the above piezoelectric transformer using the piezoelectric ceramic substrate, however a processing of polarization must be effected on the common boundary of the input portion and the output portion, e.g., in the central portion of the ceramic substrate 2, such that the respective directions of polarization are orthogonal to each other. Accordingly, a problem occurs in that, when the amplitude of the excited vibration becomes large, a distortion is concentrated on the boundary, especially in the secondary side (output portion), to thereby cause a destruction of the substrate.

Also, since ceramic material generally presents its saturation characteristics as an input voltage applied thereto is increased, a drawback arises in that, where the amplitude of the excited vibration becomes large, piezoelectric constants and elastic constants are deteriorated due to the emitted heat or other causes. This leads to a lowering of the stability or reliability in operation.

Furthermore, since the prior art piezoelectric transformer utilizes the longitudinal piezoelectric effect in the output portion thereof, a problem occurs in that the electrostatic capacitance is small and thus the output impedance becomes high, so that it is impossible to obtain a large load current.

According to the piezoelectric transformer of the present invention, an input portion thereof is driven using the transverse piezoelectric effect and thus, from an output portion thereof, an output voltage is taken out using the transverse piezoelectric effect. In this case, a step-up ratio (Vo/Vi) under no load at the output ends is expressed by the following equation:

$$Vo/Vi \propto Ki \cdot Ko \cdot Q_2 \cdot Lo/Li \quad (2)$$

Note, reference Ki (See FIG. 3b) denotes an electromechanical coupling coefficient of the transverse piezoelectric effect in the input portion (Ki<1); reference Ko an electromechanical coupling coefficient of the transverse piezoelectric effect in the output portion (Ko<1); reference $Q_2$ the mechanical "Q" of the substrate of piezoelectric material; reference Li the distance between electrodes provided in the input portion; and reference Lo the distance between electrodes provided in the output portion.

In the constitution of the present invention, the electromechanical coupling coefficient Ki is selected to be equal to the electromechanical coupling coefficient Ko and thus the step-up ratio is proportional to the square of the coupling coefficient of the transverse piezoelectric effect. Also, the factor Lo/Li is equal to one (1) in a typical structure of the piezoelectric transformer. Accordingly, from equation (2), the step-up ratio is presumed to be lower, compared with the prior art as expressed by equation (1).

By using a single crystal of LiNbO, as the substrate of piezoelectric material, however, it becomes possible to fully heighten the step-up ratio—much more than that of a prior art piezoelectric transformer—because the mechanical "Q" ($Q_2$) of the single crystal of $LiNbO_3$ is extremely high (approximately 10000). Additionally, since the piezoelectric transformer of the present invention utilizes the transverse piezoelectric effect in the output portion thereof, it is possible to increase the electrostatic capacitance and thus decrease the output impedance. Accordingly, even if a relatively large load is coupled to the piezoelectric transformer, it is possible to prevent a lowering of the step-up ratio and thus to realize a level of power transmission as in an ordinary electromagnetic transformer.

Also, it is possible to easily form the electrodes in the output portion, compared with the prior art which utilizing the longitudinal piezoelectric effect. As a result, it is possible to carry out all of the processes on a wafer and realize a low cost of the product.

Furthermore, since the single crystal is used as the piezoelectric material, it is possible to reduce dielectric loss and mechanical loss and thus heighten conversion efficiency. Namely, it is possible to suppress a rise in temperature due to the emitted heat, to stabilize the characteristics and the operation, and to improve the reliability.

Although, as to piezoelectric material such as a single crystal of $LiNbO_3$, it is normally impossible to change the respective directions of polarization in the input portion and the output portion, we found that the single crystal of $LiNbO_3$ is applicable to a substrate of the piezoelectric transformer by a suitable choice of the orientation of the cutting thereof.

Figure 2:
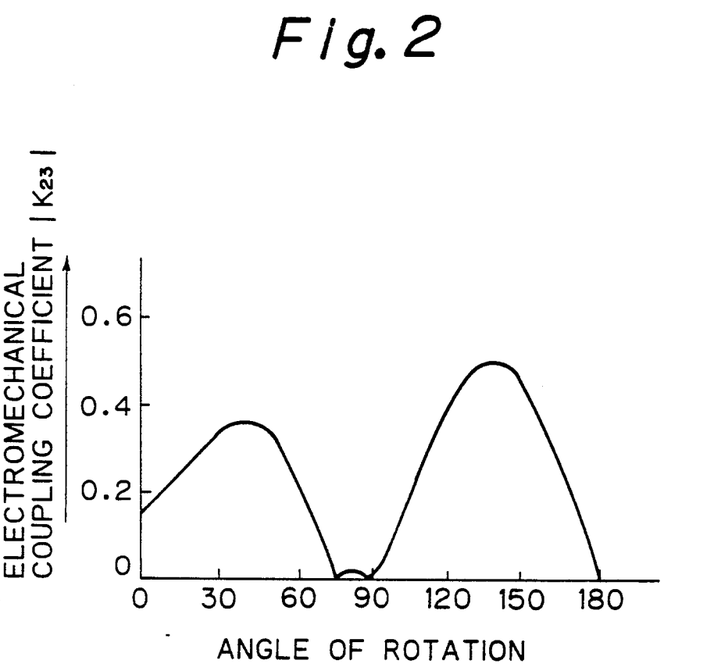
FIG. 2 is a graph showing a dependency of the electromechanical coupling coefficient relative to the angle of rotation in a rotated Y-cut substrate of a single crystal of $LiNbO_3$.

FIG. 2 shows a dependency of the electromechanical coupling coefficient ($K_{23}$ of the transverse piezoelectric effect) relative to the angle of rotation in a rotated Y-cut substrate of the single crystal of $LiNbO_2$. It was found that the electromechanical coupling coefficient presents its peak value (approximately 137°) within a range of 120° to 160° of the angle of rotation.

Figure 3A:
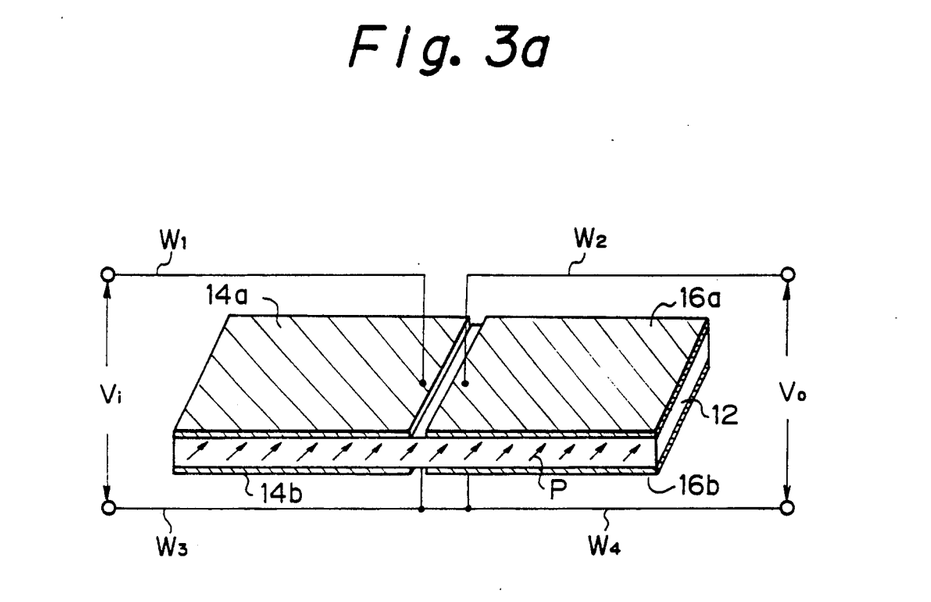
FIGS. 3a and 3b are a perspective view and a sectional view, respectively, illustrating a structure of the piezoelectric transformer comprising a first embodiment of the present invention.
Figure 3B:
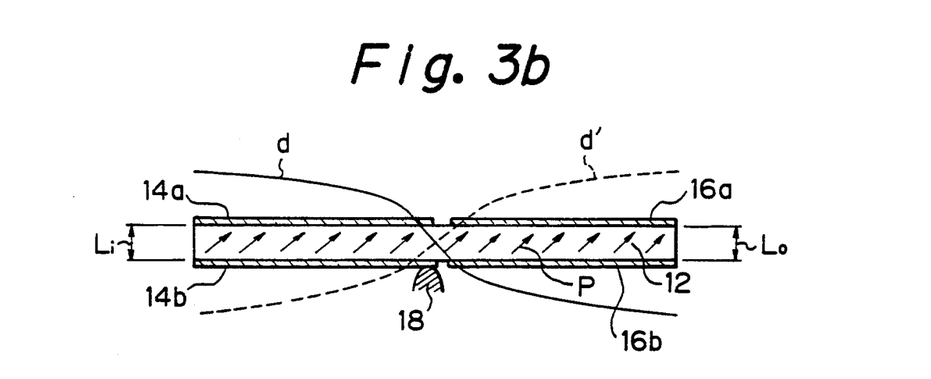

FIGS. 3a and 3b illustrate a structure of the piezoelectric transformer as comprising a first embodiment of the present invention, in a perspective view and a sectional view, respectively.

In the illustration, reference 12 denotes a substrate of piezoelectric material, e.g., a single crystal of lithium niobate ($LiNbO_3$), which is a rotated Y-cut substrate cut from the single crystal ($LiNbO_3$) uniformly polarized in a Z-axis direction thereof, as stated later. Note, arrow marks "P" indicate a direction of orientation of the polarization.

References 14a and 14b denote input electrodes which are formed on respective half portions to the left side of the central portion of the piezoelectric substrate 12. Each of the input electrodes 14a,14b is formed by first forming a layer of nickel chromium (NiCr) in a thickness of 30 nm on the substrate 12 by way of vacuum deposition and then forming a layer of gold (Au) in a thickness of 100 nm thereon by way of vacuum deposition. References 16a and 16b denote output electrodes, which are formed on respective other half portions to the right side of the central portion, of the opposite main surfaces of the piezoelectric substrate 12. Each of the output electrodes 16a,16b is also formed by first forming nickel chromium (NiCr) with a thickness of 30 nm on the substrate 12 by way of vacuum deposition and then forming a layer of gold (Au) in a thickness of 100 nm thereon by way of vacuum deposition.

Although, in the illustration, the input electrodes 14a,14b and the output electrodes 16a,16b are formed separately from each other, one of the input electrodes (14b) and one of the output electrodes (16b) may be formed, for example, as a single common electrode.

Figure 4:
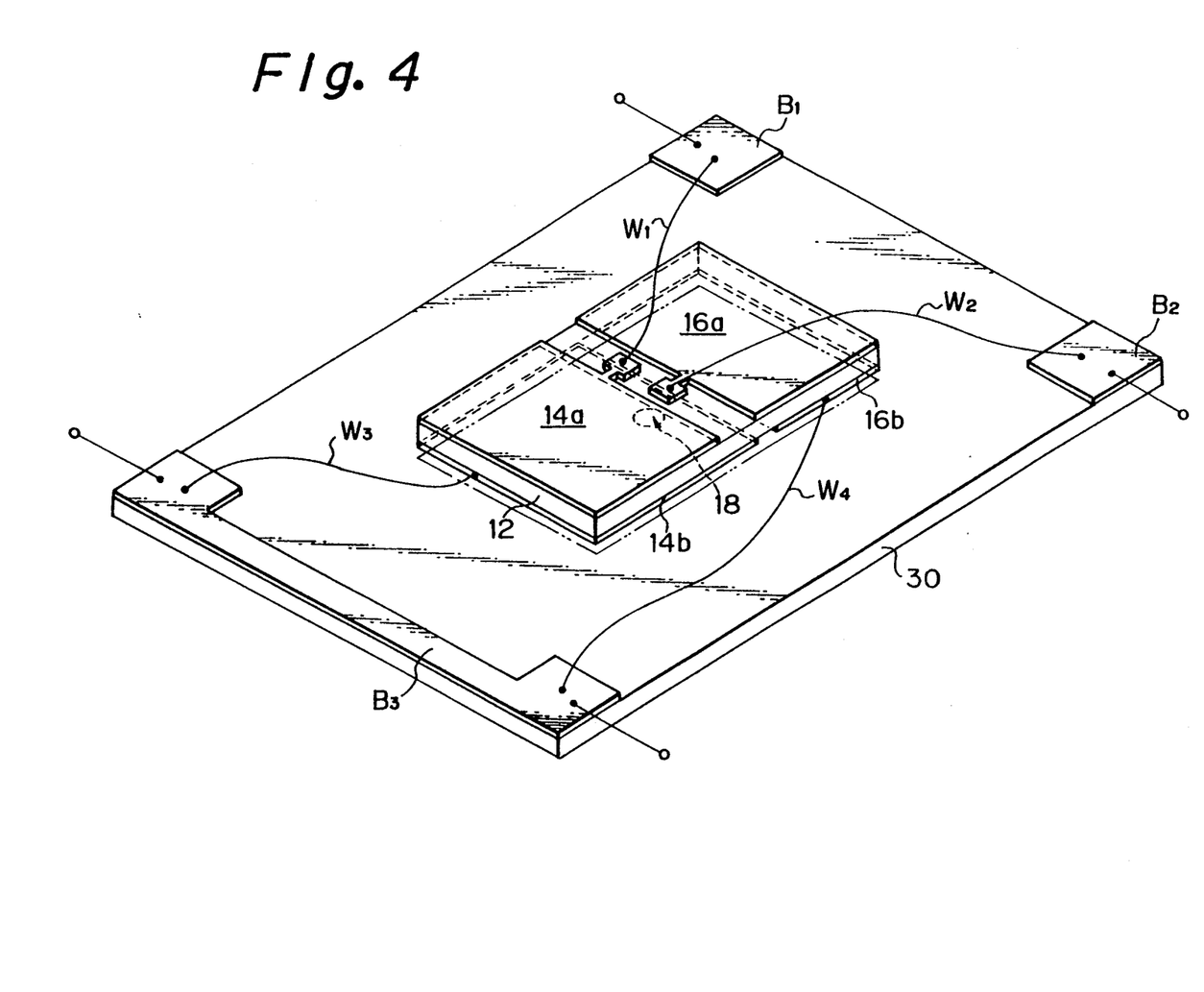
FIG. 4 is a perspective view illustrating a state in which the piezoelectric transformer shown in FIGS. 3a and 3b is mounted on a substrate.

Reference 18 denotes a member for supporting the piezoelectric transformer. In order that the vibration can be effectively excited, the supporting member 18 supports the piezoelectric transformer at the central portion thereof corresponding to a node of the excited vibration (see a solid line "d" and a broken line "d'" in FIG. 3b). The supporting member 18 has a height of 50 μm and an area of approximately 0.5 mm² and is provided on a mounting substrate 30 of a printed circuit board as shown in FIG. 4. In this case, the input electrodes 14a,14b and the output electrodes 16a,16b are connected by way of the respective bonding wires $W_1,W_3$ and $W_2,W_4$ of gold (Au) to the respective electrodes, or terminals, $B_1,B_3$ and $B_2,B_4$ formed on the substrate 30. Note, in order to prevent the excited vibration from being obstructed, it is preferable to take the lead portions for the electrodes 14a,14b,16a and 16b from a region in the vicinity of the node of the excited vibration.

Figure 5:
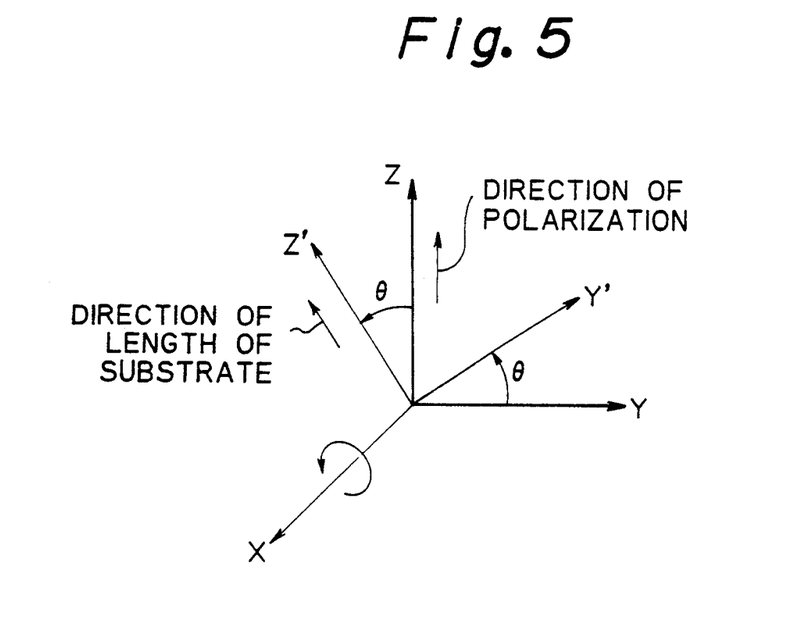
FIG. 5 is an explanatory view of a rotated Y-cut substrate.

The concept of the rotated Y-cut substrate is explained with reference to FIG. 5.

In the illustration, the coordinates including X-axis, Y-axis and Z-axis indicate reference orientations in the single crystal of $LiNbO_3$, and the coordinates including X-axis, Y'-axis and Z'-axis are obtained when the original coordinates (X,Y,Z) are rotated by angle $\theta$ about the X-axis. In the present example, the angle $\theta$ is selected to be 140° and the single crystal of $LiNbO_3$ is cut such that the plane including the X-axis and Z'-axis is parallel to that of the substrate 12. Note, the longitudinal direction of the plane is selected along the Z'-axis.

In FIGS. 3a and 3b, when an input voltage Vi with a resonant frequency determined by the dimension in the direction of the length of the substrate 12 is applied by an alternating current (AC) power source (not shown) across the input electrodes 14a and 14b, a fundamental mode vibration with half-wave length resonance is excited in the direction of the length of the substrate 12 as shown by a solid line "d" and a broken line "d'". As a result, a transverse piezoelectric effect is caused to thereby generate a high output voltage Vo across the output electrodes 16a and 16b. Accordingly, the step-up ratio (Vo/Vi) can be determined by measuring the output voltage Vo, for example, by means of an AC voltmeter with high impedance.

Figure 6:
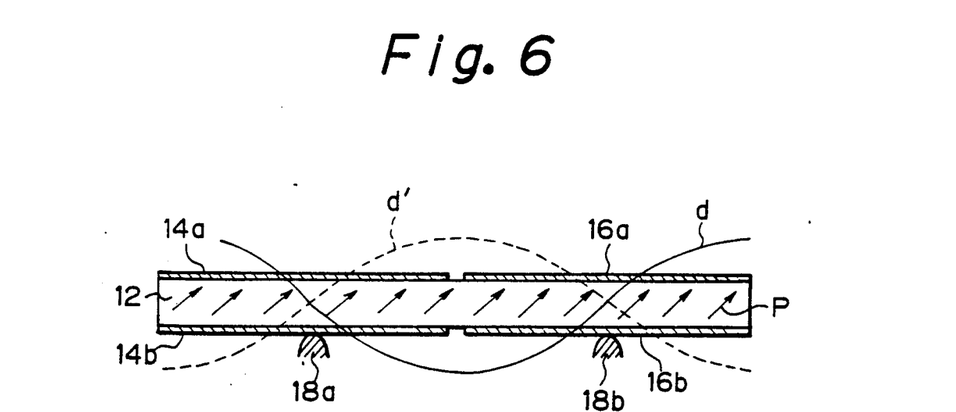
FIG. 6 is a sectional view illustrating a structure of the piezoelectric transformer comprising a second embodiment of the present invention.

FIG. 6 illustrates a structure of the piezoelectric transformer according to a second embodiment, in a sectional view thereof.

In the present embodiment of FIG. 6, the substrate 12 has a length of 20 mm, a width of 7 mm and a thickness of 0.5 mm. Also, each of the input electrodes 14a,14b has a length of approximately 9.5 mm and a thickness of 130 nm, and each of the output electrodes 16a,16b has a length of approximately 8.5 mm and a thickness of 130 nm. Namely, the input electrodes 14a,14b and the output electrodes 16a,16b are formed separately from each other with a gap of approximately 2 mm therebetween. Note, each electrode is formed by the same process as in the embodiment of FIGS. 3a and 3b, and thus, the explanation thereof is omitted.

The embodiment of FIG. 6 shows a case in which an input voltage with a specific resonant frequency (one-wave length resonance) is applied across the input electrodes 14a and 14b to thereby excite a vibration of a secondary mode in the direction of the length of the substrate 12, as shown by a solid line "d" and a broken line "d'". In this case, since the excited vibration of secondary mode has two nodes in the substrate 12, two supporting members 18a and 18b are accordingly provided at the respective portions of the piezoelectric transformer corresponding to the two nodes. These supporting members 18a,18b can be provided, in the same manner as in the embodiment of FIGS. 3a and 3b, on the substrate 30 shown in FIG. 4.

According to the embodiment of FIG. 6, it is possible to heighten the a stability of the piezoelectric transformer the mounting thereof on the substrate 30 by the provision of the two supporting members 18a,18b. Also, by taking the lead portions for the electrodes 14a, 14b and 16a,16b from the respective regions in the vicinity of the two nodes of the excited vibration, it is possible to prevent a lowering in the mechanical "Q" ($Q_2$) and a disconnection of the lead portions (bonding wires).

Figure 7:
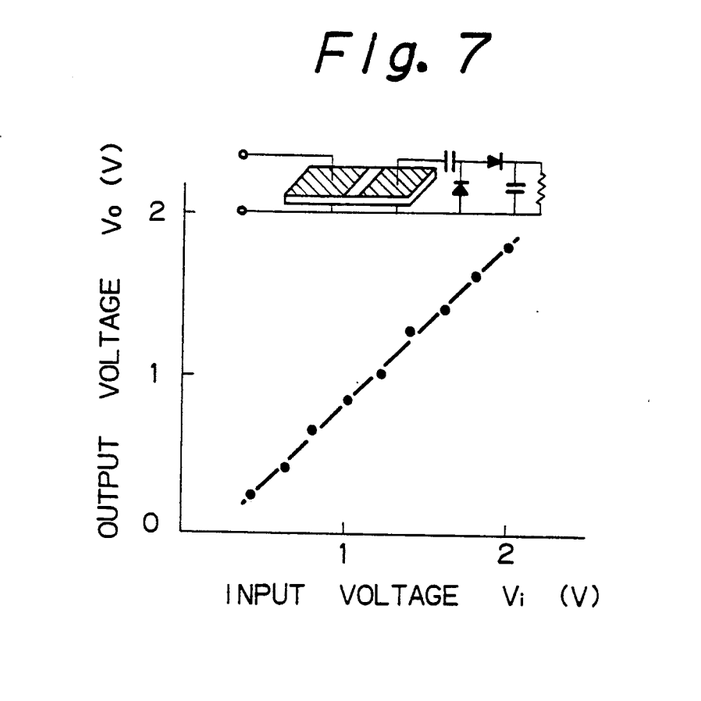
FIG. 7 is a graph showing a relationship between the input voltage and the output voltage of the piezoelectric transformer shown in FIG. 6.

FIG. 7 is a graph representing a relationship between the input voltage and the output voltage in the piezoelectric transformer shown in FIG. 6.

In this case, the resonant frequency of the vibration of the secondary mode is approximately 303 kHz. The input voltage Vi is expressed by an effective value (root mean square value) and the output voltage vo is expressed by a rectified direct current voltage. Also, the rectifying circuit employs a load resistor of 100 MΩ and a capacitor of 4700 pF, for cutting off ripples. As seen from the illustration, a relatively high step-up ratio (approximately 820) can be obtained with a simple constitution, and the characteristics present a good linearity.

Figure 8:
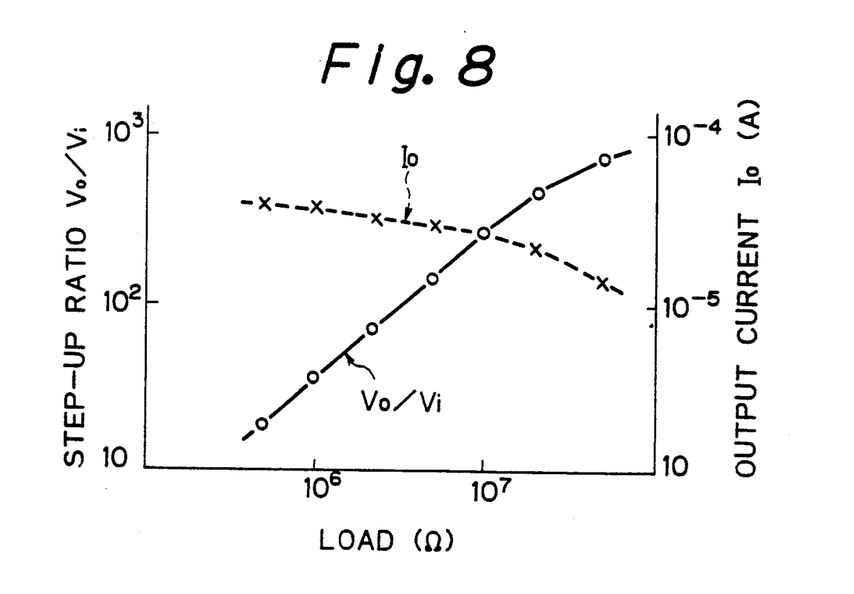
FIG. 8 is a graph showing dependencies of the step-up ratio and the output current relative to the load resistance.

FIG. 8 shows dependencies of the step-up ratio (Vo/Vi) and the output current (Io) relative to the load resistance in the piezoelectric transformer shown in FIG. 6.

The illustrated graph represents data obtained when the input voltage Vi is 1 [V]. As seen from the graph, it will be found that, for example, to take an output voltage of 500 [v]out of the load resistor of 5 MΩ, an input voltage Vi of only approximately 3.3 [V] is necessary.

Although, in the embodiment of FIG. 6, the vibration of the secondary mode is employed, it is not restrictive. For example, a higher harmonic vibration may be excited, if necessary.

Figure 9:
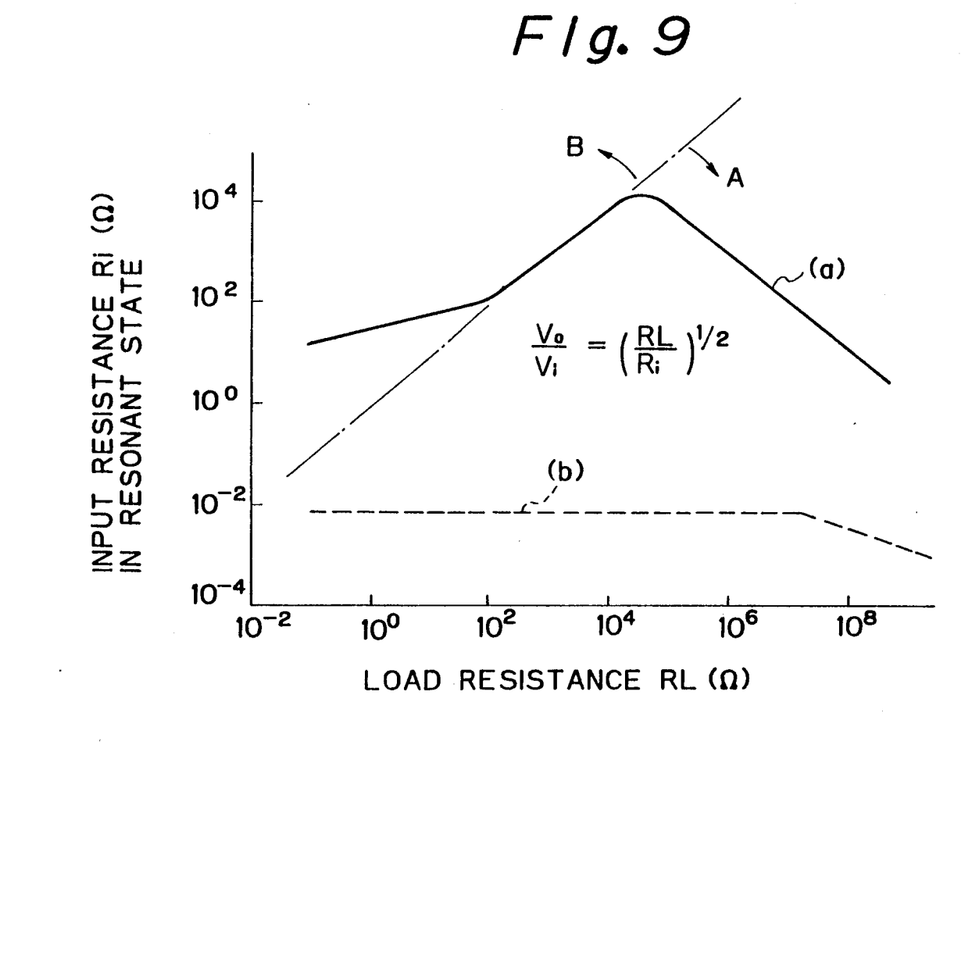
FIG. 9 is a graph showing a dependency of the input resistance in the resonant state relative to the load resistance.

FIG. 9 shows a dependency of the input resistance (Ri) in the resonant state relative to the load resistance (RL).

In the illustration, the curve indicated by a solid line (a) shows the characteristics of the present invention (input portion transverse piezoelectric effect; output portion transverse piezoelectric effect), and the curve indicated by a broken line (b) shows the characteristics of the prior art of FIGS. 1a and 1b (input portion→transverse piezoelectric effect; output portion→longitudinal piezoelectric effect). The respective characteristics are calculated by a computer simulation using the well-known Mason's equivalent circuit model.

The piezoelectric substrate, employed as a sample, is a rotated Y-cut substrate cut from a single crystal of LiNbO$_3$, the angle of rotation being selected to be 128°. The substrate has a length of approximately 30 mm, a width of 6.6 mm and a thickness of approximately 0.5 mm Also, each of the input electrodes and the output electrodes has a length of approximately 14.5 mm.

In the graph of FIG. 9, the region indicated by an arrow mark "A" shows a step-up operation region of the piezoelectric transformer, and the region indicated by an arrow mark "B" shows a step-down operation region thereof. As seen from the graph, the piezoelectric transformer of the present invention can cope with both the step-up transforming operation and the step-down transforming operation.

Note, from the characteristics of FIG. 9, it is possible to estimate the approximate step-up ratio, or the magnitude of power transmissible from a given power source.

Figure 10:
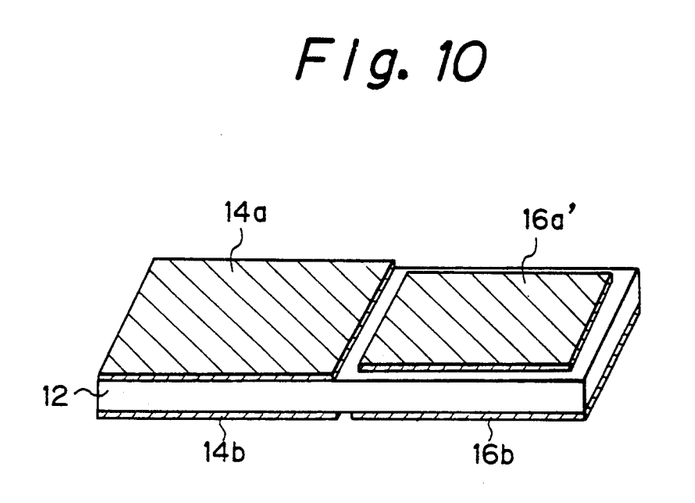
FIG. 10 is a perspective view illustrating a structure of the piezoelectric transformer comprising a third embodiment of the present invention.

FIG. 10 illustrates a structure of the piezoelectric transformer according to a third embodiment, in perspective view thereof.

In the above embodiments, when the input voltage is increased to a some extent, a possibility occurs of a discharge being caused between the output electrodes for an output voltage in the range of approximately five or six kilovolts. This is because the thickness of the substrate 12 is relatively small and thus the dielectric breakdown voltage of air is reached. The embodiment of FIG. 10 is proposed to cope with this disadvantage.

The present embodiment of FIG. 10 is characterized in that the periphery of at least one electrode, of the input electrodes and the output electrodes (in the present example, output electrode 16a') is formed inwardly by a width of approximately 1 mm, from the periphery of the substrate 12. By this structure, it is possible to obtain approximately twice the output voltage without causing any dielectric breakdown. Note, it also follows that other electrodes may also be formed inwardly from the periphery of the substrate 12, if necessary.

Figure 11:
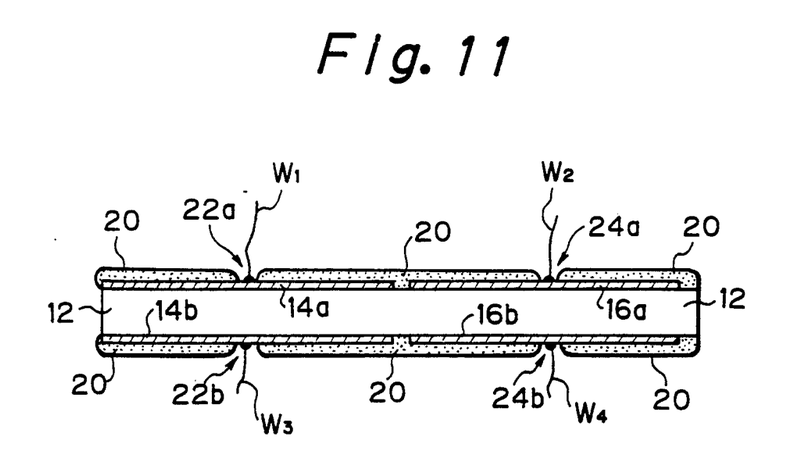
FIG. 11 is a sectional view illustrating a structure of the piezoelectric transformer comprising a fourth embodiment of the present invention.

FIG. 11 illustrates a structure of the piezoelectric transformer according to a fourth embodiment of the invention, showing in a sectional view thereof.

The present embodiment is characterized in that a protection film 20 is formed on both sizes of the substrate 12, except on regions thereof corresponding to the locations of terminal lead portions 22a,22b,24a and 24b provided for the electrodes. By this structure, it is possible to protect the electrode portions and prevent a dielectric breakdown from occurring in the output electrodes. The protection film 20 is made of silicon dioxide (SiO$_2$) with a thickness of 0.5 to 1.0 μm and formed by means of sputtering. Alternatively, the protection film 20 is made of silicon nitride (SiNx) with the same thickness as SiO$_2$ and formed by means of chemical vapor deposition. Also, the terminal lead portions 22a,22b,24a and 24b are formed to have a suitable area, respectively, by means of ion etching. The bonding wires W$_1$ to W$_4$ are taken out of the terminal lead portions and connected to the corresponding external electrodes (see FIG. 4, electrodes B$_1$ to B$_3$).

Additionally, the embodiment of FIG. 11 may be combined with the embodiment of FIG. 10 to thereby obtain a better effect caused by the respective, combined features.

Although, in the above embodiments, the single crystal of LiNbO$_3$ is employed as piezoelectric material constituting the substrate 12, it is not restrictive. For example, a single crystal of lithium tantalate (LiTaO$_3$) can be employed as the piezoelectric material.

Although the present invention has been disclosed and described by way of four embodiments, it is apparent to those skilled in the art that other embodiments and modifications of the present invention are possible without departing from the spirit or essential features thereof.

We claim:

1. A piezoelectric transformer comprising:
   a substrate of piezoelectric material comprising a rotated Y-cut substrate of a single crystal of lithium niobate uniformly polarized in a Z-axis direction thereof, an angle of rotation in the rotated y-cut substrate being selected to be in the range of approximately 120° to 160°, a portion of the substrate receiving an electrical field in a direction of the thickness thereof and another portion of the substrate having another electrical field produced therein, by way of piezoelectric effect, in the direction of the thickness thereof and thus producing an output voltage; and
   means for supporting the substrate at at least one portion thereof corresponding to a node of an excited vibration produced therein by the receipt of the electrical field.

2. A piezoelectric transformer as set forth in claim 1, further comprising a pair of input electrodes affixed on the substrate and by which the electrical field is applied to the substrate, and a pair of output electrodes affixed on the substrate and by which the output voltage is taken out.

3. A piezoelectric transformer as set forth in claim 2, wherein the pair of input electrodes is formed on respective, opposite main surfaces of a first half portion thereof, and the pair of output electrodes is formed on respective, opposite main surfaces of a second half portion of the substrate.

4. A piezoelectric transformer as set forth in claim 3, wherein the periphery of at least one electrode, of the pair of input electrodes and the pair of output electrodes, is disposed inwardly from the corresponding periphery of the substrate.

5. A piezoelectric transformer as set forth in claim 4, wherein the at least one electrode having an inwardly disposed periphery is one of the output electrodes.

6. A piezoelectric transformer as set forth in claim 3, wherein first regions of the main surfaces of the substrate and of the input and output electrodes formed thereon are defined for providing terminal lead connections to the respective input and output electrodes, and further comprising a protection film formed on second regions of at least one of the main surfaces of the substrate and of the respective input and output electrodes formed thereon, the second regions being other than the first regions of the substrate.

7. A piezoelectric transformer as set forth in claim 4, wherein first regions of the main surfaces of the substrate and of the input and output electrodes formed thereon are defined for providing terminal lead connections to the respective input and output electrodes, and further comprising a protection film formed on second regions of at least one of the main surfaces of the substrate, and of the respective input and output electrodes formed thereon the second regions being other than the first regions of the substrate.

8. A piezoelectric transformer as set forth in claim 6, wherein the protection film comprises silicon oxide.

9. A piezoelectric transformer as set forth in claim 6, wherein the protection film comprises silicon nitride.

10. A piezoelectric transformer as set forth in claim 1, wherein the angle of rotation, in the rotated Y-cut substrate of a single crystal of lithium niobate, is selected to be approximately 140°.

11. A piezoelectric transformer comprising:
a substrate of piezoelectric material comprising a rotated Y-cut substrate of a single crystal of lithium niobate uniformly polarized in a Z-axis direction thereof and vibrated in a direction of the length thereof, an angle of rotation in the rotated Y-cut substrate being selected to be in the rang of approximately 120° to 160°, a first portion of the substrate receiving a first portion of the substrate receiving an input voltage in a direction of the thickness thereof and thus exciting a vibration, by way of a piezoelectric effect, in a second portion of the substrate, other than the first portion, and produces an output voltage therein in the direction of the thickness thereof; and
means for supporting the substrate at at least one portion thereof corresponding to a node of the excited vibration produced therein.

12. A piezoelectric transformer as set forth in claim 11, wherein the vibration exited in the direction of the length of the substrate is a fundamental wave vibration of a longitudinal mode and with a half-wave length resonance.

13. A piezoelectric transformer as set forth in claim 11, wherein the vibration excited in the direction of the length of the substrate is a vibration of a secondary, longitudinal mode with a one-wave length resonance.

14. A piezoelectric transformer as set forth in claim 11, further comprising a pair of input electrodes formed in the respective, opposite main surfaces of the first portion of the substrate and to which the input voltage, received by the first portion of the substrate, is applied and a pair of output electrodes formed on respective, opposite main surfaces of the second portion of the substrate and from which the output voltage produced in the second portion of the substrate is taken out.

15. A piezoelectric transformer as set forth in claim 14, wherein the first and second portions of the substrate comprise, substantially, first and second half portion of the substrate.

16. A piezoelectric transformer as set forth in claim 13, wherein a periphery of at least one electrode, of the pair of input electrodes and the pair of output electrodes, is disposed inwardly from the corresponding periphery of the substrate.

17. A piezoelectric transformer as set forth in claim 16, wherein the at least one electrode is one of the output electrodes.

18. A piezoelectric transformer as set forth in claim 15, wherein first regions of the main surfaces of the substrate and of the input and output electrodes formed thereon are defined for providing terminal lead connections to the respective input and output electrodes, and further comprising a protection film formed on second regions of at least one of the main surfaces of the substrate and of the respective input and output electrodes formed thereon, the second regions being other than first regions of the substrate.

19. A piezoelectric transformer as set forth in claim 16, wherein first regions of the main surfaces of the substrate and of the input and output electrodes formed thereon are defined for providing terminal lead connections to the respective input and output electrodes, and further comprising a protection film formed on second regions of at least one of the main surfaces of the substrate and of the respective input and output electrodes formed thereon, the second regions being other than first regions of the substrate.

20. A piezoelectric transformer as set forth in claim 18, wherein the protection film comprises silicon dioxide.

21. A piezoelectric transformer as set forth in claim 18, wherein the protection film comprises silicon nitride.

22. A piezoelectric transformer as set forth in claim 11, wherein the angle of rotation, in the rotated Y-cut substrate of a single crystal of lithium niobate, is selected to be approximately 140°.

23. A piezoelectric transformer unit comprising:
a piezoelectric transformer including a substrate of piezoelectric material comprising a rotated Y-cut substrate of a single crystal of lithium niobate uniformly polarized in a Z-axis direction thereof and vibrated in a direction of the length thereof, an angle of rotation in the rotated Y-cut substrate being selected to be in the range of approximately 120° to 160°, a first portion of the substrate receiving an input voltage in a direction of the thickness thereof and thus exciting a vibration, by way of a piezoelectric effect, in a second portion of the substrate, other than the first portion, and producing an output voltage therein in the direction of the thickness thereof;

a second substrate; and a supporting member provided on the second substrate and supporting the piezoelectric transformer at a portion thereof corresponding to a node of the excited fundamental wave vibration with half-wave length resonance.

24. A piezoelectric transformer unit comprising:

a piezoelectric transformer including a substrate of piezoelectric material comprising a rotate Y-cut substrate of a single crystal of lithium niobate uniformly polarized in a Z-axis direction thereof and vibrated in a direction of the length thereof, an angle of rotation in the rotated Y-cut substrate being selected to be in the range of approximately 120° to 160°, a first portion of the substrate receiving an input voltage in a direction of the thickness thereof and thus exciting a vibration, by way of a piezoelectric effect, in a second potion of the substrate, other than the first portion, and producing an output voltage therein in the direction of thickness thereof;

a second substrate; and a pair of supporting members provided on the second substrate and supporting the piezoelectric transformer at two portions thereof respectively corresponding to nodes of the excited vibration of secondary mode with one-wave length resonance.

25. A piezoelectric transformer as set forth in claim 7, wherein the protection film comprises silicon dioxide.

26. A piezoelectric transformer as set forth in claim 7, wherein the protection film comprises silicon nitride.

27. A piezoelectric transformer as set forth in claim 19, wherein the protection film comprises silicon dioxide.

28. A piezoelectric transformer as set forth in claim 19, wherein the protection film comprises silicon nitride.

29. A piezoelectric transformer as set forth in claim 23, wherein the angle of rotation, in the rotated Y-cut substrate of a single crystal of lithium niobate, is selected to be approximately 140°.

30. A piezoelectric transformer as set forth in claim 24, wherein the angle of rotation, in the rotated Y-cut substrate of a single crystal of lithium niobate, is selected to be approximately 140°.

* * * * *

UNITED STATES PATENT AND TRADEMARK OFFICE
CERTIFICATE OF CORRECTION

PATENT NO. : 5,229,680
DATED : July 20, 1993
INVENTOR(S) : SATO et al.

It is certified that error appears in the above-indentified patent and that said Letters Patent is hereby corrected as shown below:

Col. 1, line 52, change "enhancer" to --enhance,--.

Col. 2, line 22, change "respective," to --the--;
line 23, delete "opposite" and after "and" insert --the--;
line 24, change "both" to --respective, opposite--.

Col. 3, line 33, after "Also," insert --in the--;
line 36, after "electrode" insert --,-- and change "with" to --as the--.

Col. 4, line 68, change "utilizing" to --utilizes--.

Col. 5, line 5, after "heighten" insert --the--;
line 37, after "portion" insert --,-- and after "of" (second occurrence) insert --the opposite main surfaces of--;
line 44, after "respective" insert --,--;
line 48, change "with" to --in--.

Col. 8, line 17, delete "showing";
line 62, after "of" insert --a--.

UNITED STATES PATENT AND TRADEMARK OFFICE
CERTIFICATE OF CORRECTION

PATENT NO. : 5,229,680
DATED : July 20, 1993
INVENTOR(S) : SATO et al

It is certified that error appears in the above-indentified patent and that said Letters Patent is hereby corrected as shown below:

Col. 11, line 14, change "rotate" to --rotated--.

Signed and Sealed this

Fifth Day of July, 1994

Attest:

BRUCE LEHMAN

Attesting Officer         Commissioner of Patents and Trademarks